(12) United States Patent
Kimoto (10) Patent No.: US 7,622,937 B2
(45) Date of Patent: Nov. 24, 2009

(54) ELECTRICAL SIGNAL CONNECTOR

(76) Inventor: Gunsei Kimoto, 1-3-2-807, Daiba, Minato-ku, Tokyo (JP)

( * ) Notice: Subject to any disclaimer, the term of this patent is extended or adjusted under 35 U.S.C. 154(b) by 0 days.

(21) Appl. No.: 12/180,695

(22) Filed: Jul. 28, 2008

(65) Prior Publication Data

US 2009/0033348 A1 Feb. 5, 2009

(30) Foreign Application Priority Data

Aug. 1, 2007 (JP) ............................. 2007-223243

(51) Int. Cl.
*G01R 31/02* (2006.01)
(52) U.S. Cl. ....................... 324/754; 439/482
(58) Field of Classification Search ......... 324/754–765, 324/158.1
See application file for complete search history.

(56) References Cited

U.S. PATENT DOCUMENTS

| | | | |
|---|---|---|---|
| 5,059,898 A * | 10/1991 | Barsotti et al. ............... | 324/762 |
| 5,084,672 A * | 1/1992 | Ikeuchi et al. ................ | 324/761 |
| 5,736,850 A | 4/1998 | Legal | |
| 5,864,946 A | 2/1999 | Eldridge et al. | |
| 6,034,534 A * | 3/2000 | Kiyota ......................... | 324/762 |
| 6,114,864 A * | 9/2000 | Soejima et al. .............. | 324/754 |
| 6,130,543 A * | 10/2000 | Iino ............................. | 324/754 |
| 6,150,830 A | 11/2000 | Schmid et al. | |
| 6,326,688 B1 | 12/2001 | Ochiai | |
| 6,330,744 B1 | 12/2001 | Doherty et al. | |
| 6,496,026 B1 * | 12/2002 | Long et al. ................... | 324/762 |
| 6,633,212 B1 | 10/2003 | Ruan et al. | |

(Continued)

FOREIGN PATENT DOCUMENTS

EP 0802419 A2 10/1997

(Continued)

OTHER PUBLICATIONS

Faure, "Modular Probe"; IBM Technical Disclosure Bulletin, Nov. 1974, vol. 17, No. 6, p. 1634.

(Continued)

*Primary Examiner*—Ha Tran T Nguyen
*Assistant Examiner*—Richard Isla Rodas
(74) *Attorney, Agent, or Firm*—Haynes and Boone, LLP (57) ABSTRACT

A probe card which can be used for testing narrow-pitched chips or multi-chips, and causes no faulty connections between probes and pads or between probes and a circuit board even in a high temperature environment such as in a burn-in test is provided. For this purpose, probe units in which multiple film probes are supported by support rods in a stacked or parallel-arranged manner are placed and fixed in each of the openings in a grid support. A plurality of fixing devices protruding from the grid support at a side to be connected to the circuit board are provided to be inserted in corresponding holes in the circuit board to fix the grid support to the circuit board. There is no or subtle difference between an outer diameter of an inserting section of the fixing device and an inner diameter of the hole in the circuit board around the center of the circuit board with the inserting section inserted in the hole, and the difference is larger at the rest of the area of the circuit board.

9 Claims, 10 Drawing Sheets

U.S. PATENT DOCUMENTS

| | | | |
|---|---|---|---|
| 6,731,123 B2 | 5/2004 | Kimoto | |
| 6,882,168 B2 * | 4/2005 | Root | 324/754 |
| 7,015,710 B2 * | 3/2006 | Yoshida et al. | 324/754 |
| 7,511,519 B2 | 3/2009 | Kimoto | |
| 2002/0155736 A1 | 10/2002 | Kimoto et al. | |
| 2002/0186030 A1 | 12/2002 | Yoshida et al. | |
| 2003/0067315 A1 | 4/2003 | Kimoto | |
| 2005/0001643 A1 | 1/2005 | Yoshida et al. | |
| 2005/0099194 A1 | 5/2005 | Mine et al. | |
| 2006/0049840 A1 * | 3/2006 | Ito et al. | 324/754 |
| 2009/0033349 A1 * | 2/2009 | Kimoto | 324/754 |

FOREIGN PATENT DOCUMENTS

| | | |
|---|---|---|
| JP | 2001-183392 | 7/2001 |
| JP | 2002-296297 | 10/2002 |
| JP | 2003-075503 | 3/2003 |

OTHER PUBLICATIONS

European Search Report issued Mar. 29, 2007 in Application No. EP 05 25 5613.

Richard Isla-Rodas, "Office Action," Sep. 28, 2006, 6 pages, issued in U.S. Appl. No. 11/080,601, U.S. Patent and Trademark Office.

Richard Isla-Rodas, "Office Action," Dec. 28, 2006, 10 pages, issued in U.S. Appl. No. 11/080,601, U.S. Patent and Trademark Office.

Richard Isla-Rodas, "Office Action," Jul. 11, 2007, 9 pages, issued in U.S. Appl. No. 11/080,601, U.S. Patent and Trademark Office.

Richard Isla-Rodas, "Notice of Allowance and Fees Due," Oct. 18, 2007, 8 pages, issued in U.S. Appl. No. 11/080,601, U.S. Patent and Trademark Office.

Richard Isla-Rodas, "Notice of Allowance and Fees Due," Dec. 28, 2007, 11 pages, issued in U.S. Appl. No. 11/080,601, U.S. Patent &Trademark Office.

Richard Isla-Rodas, "Notice of Allowance and Fee(s) Due," Dec. 1, 2008, 9 pgs., issued in U.S. Appl. No. 12/053,282, U.S. Patent and Trademark Office.

Richard Isla-Rodas, "Office Action," Aug. 8, 2008, 9 pgs., issued in U.S. Appl. No. 12/053,282, U.S. Patent and Trademark Office.

\* cited by examiner

ELECTRICAL SIGNAL CONNECTOR

BACKGROUND OF THE INVENTION

1. Field of the Invention

The present invention relates to a prober unit for testing circuits of semiconductor chips on a semiconductor wafer in the manufacturing process of electronic devices including LSI. More particularly, the present invention relates to an electrical signal connector which includes a probe assembly of a prober apparatus for use in a probing test. In the probing test, circuit terminals (pads) arranged on the semiconductor chips on a wafer are made to contact with vertical probes for collective measurement of electrical conductivity of the semiconductor chips.

2. Description of the Related Art

As the semiconductor technology advances, electronic devices have become more highly integrated and a circuit wiring area has increased in each wafer chip. Pads on each wafer chip have also increased in number, and have become more precisely arranged, whereby pad areas become smaller and pad pitches becomes narrower. The pad pitch will become as narrow as 20 μm in the near future.

Chip size packaging (CSP) becomes dominant in which a bear, non-packaged chip is mounted on a circuit board or other substrate. In fabricating the CSP, characteristics and quality of the chips should be verified at the wafer level.

In an exemplary inspection process, a contact element assembly is disposed between test equipment and pads on semiconductor chips. The contact element assembly includes needle probes each having a section which is elastically deformable due to external force. A printed circuit board called probe card is used for electrically connecting the contact element assembly and test circuits on the semiconductor chips.

The section of the probe card that interfaces with the test head of the test equipment should have compatibility in shape and pitches with those of the test head. At the same time, the section of the probe card near the probes and in contact with the wafer should have compatibility in shape and pitches with those of the chip pad.

A multilayer substrate may be used for converting pitches of closely arranged wirings near the probes into wider pitches of the terminals on the circuit board of the test head.

Figure 10:
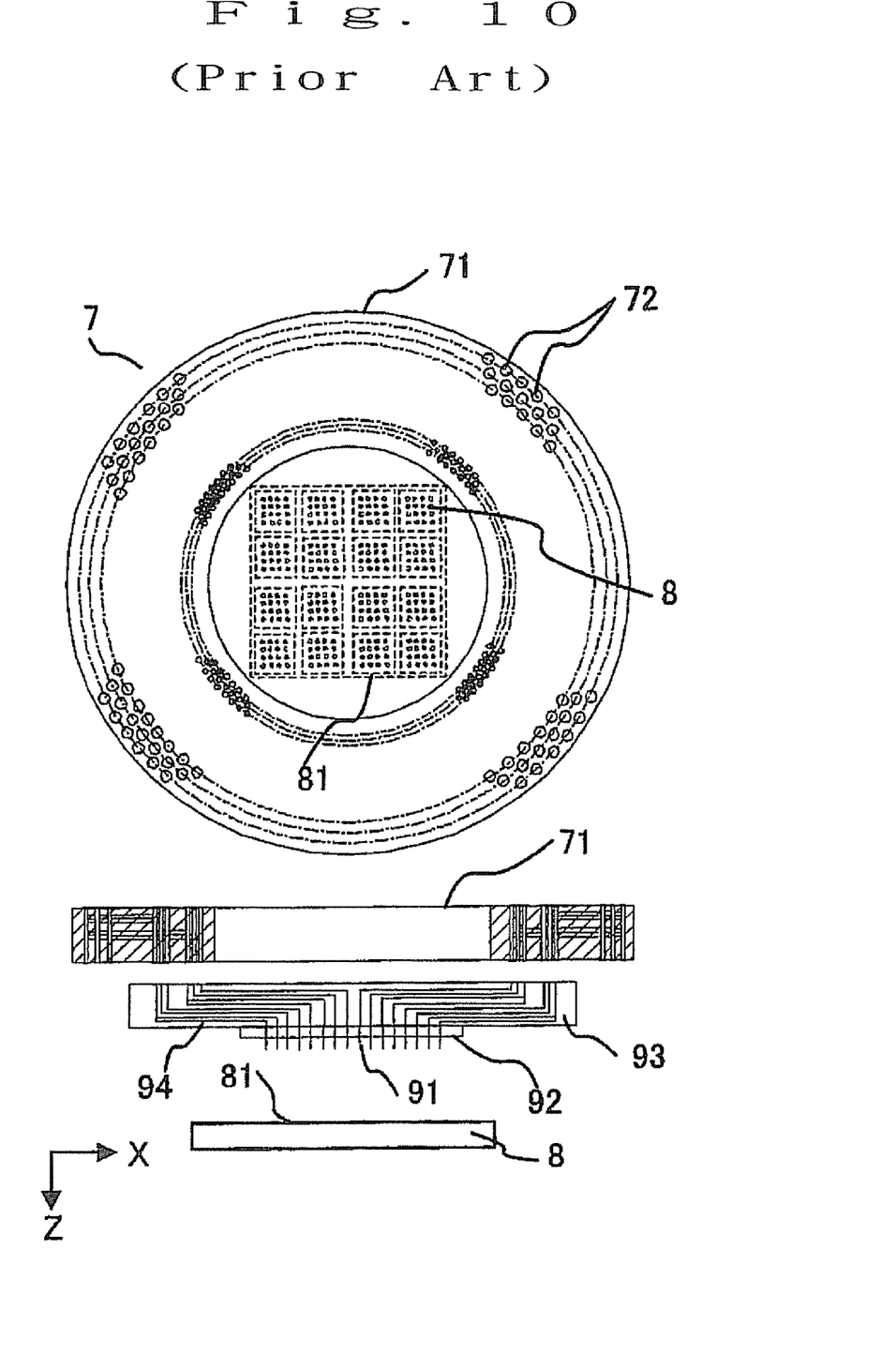
FIG. 10 schematically shows a structure of a conventional probe card.

FIG. 10 shows an example of a conventional probe card which includes a probe card 7 and card substrate 71 to be connected to a test head. A chip 81 to be tested is shown in a perspective view to clarify its positional relationship with the card substrate 71. Terminals 72 arranged at the periphery of the card substrate 71 interface with a test head (not shown) of test equipment. The terminals 72 include sections that have compatibility in shape and pitch with those of the test head.

Probes 91 are attached by a probe alignment fixing device 92 so as to correspond to terminal pads 82 on the chip 81 to be tested on the wafer 8. The probe alignment fixing device 92 can be selected depending on the probe type. A cantilever type probe alignment fixing device 92 may be used for directly soldering the probes 91 to the circuit board. A probe sheet type probe alignment fixing device 92 may include a sheet member such as an electric insulating film having parallel belt-like wirings formed on one side thereof, and a part of the wiring is used as a probe element. An example is shown in Japanese Patent Application Laid-Open No. 2001-183392.

As the chips become more highly-integrated and narrow-pitched, wiring patterns at the periphery of the probe become more and more closely arranged. In order to finally distribute the wiring to peripheral terminals of the card substrate 71, the wiring substrate must be a multi-layer substrate having the wiring arranged densely at the periphery of the probe terminals. In a current practical patterning of a printed circuit board, about 128 to 160 wirings per signal layer is appropriate. For example, a circuit tester with about 1000 pins requires over 20 layers including a power supply layer, having thickness of 4.8 to 6.5 mm, and diameter of about 350 mm.

In terms of economical efficiency of a probe card and a standardized card substrate 71, a conversion wiring board 93 may be disposed between the probe card and the wafer so as to function as a complicated conversion wiring 94 which varies depending on the pad to be tested (See Japanese Patent Application Laid-Open No. 2001-183392).

However, in a conventional electrical signal connector, the wafer may be subject to serious thermal expansion or contraction near the probes due to temperature rise. As a result, the probe contact elements and the chip pads become relatively displaced to cause some probes removed from the pad. In a multilayer substrate for wiring conversion, if the wiring from the probe is firmly connected to the multilayer substrate by means of wiring or pattern wiring, the probe and the connector may disadvantageously be disconnected due to different thermal expansion coefficient in the probe and the wafer. As a result, the wafer cannot be tested any more.

In view of the aforementioned, an object of the invention is to provide an electrical signal connector used for an electrical connection test of semiconductor chips. The electrical signal connector can be used for testing narrow-pitched chips. Even if the invention is used for burn-in testing in which a wafer is placed in a heating device, or if many chips are to be tested simultaneously, occurrence of misalignment between the probes and the pads due to temperature rise can be reduced. Even if misalignment occurs, faulty connection between the probes and the pads or between the probes and the circuit board can be avoided.

SUMMARY OF THE INVENTION

The invention is an electrical signal connector provided in a probe, the probe being a resin-made film probe which includes a resin film with metal foil disposed thereon; a conductive pattern with proving function made of a conductive material on the resin film formed through etching the metal foil; a probe tip provided at the conductor protruding from an edge of the resin film; and an output terminal provided at the conductor protruding from an opposite edge of the probe to a circuit board which is electrically connected to a tester, the electrical signal connector including: a probe unit in which multiple resin-made film probes are supported by multiple support rods in a stacked or parallel arranged manner to correspond to one or more pads on a semiconductor chip to be tested; and a grid support which includes multiple openings, each of the probe units separately placed and fixed in each of the openings.

In the invention, multiple fixing devices are provided to protrude from the grid support at a side to be connected to the circuit board. The fixing devices are inserted in corresponding holes in the circuit board to fix the grid support to the circuit board.

In the invention, there is no or subtle difference (i.e., clearance) between an outer diameter of an inserting section of the fixing device and an inner diameter of the hole in the circuit board around the center of the grid substrate with the inserting section inserted in the hole, and the difference is larger at the rest of the area of the circuit board. Further, the difference between an outer diameter of an inserting section of the fixing device and an inner diameter of the hole in the circuit board in areas other than around the center of the circuit board becomes successively or intermittently larger toward an outer periphery of the circuit board.

In the invention, operation of the fixing device in areas other than around the center of the circuit board is not restricted in a surface direction (e.g., X and Y directions in an XY two-dimensional coordinate system set on a surface of the circuit board, of which coordinate axes extending in the vertical and horizontal directions of the circuit board, hereinafter simply referred to "X and Y directions") of the circuit board.

In the invention, in a state in which the grid support is fixed to the circuit board, the output terminal of the resin-made film probe is pressed against a terminal of the circuit board with larger force than the predetermined, and is not restricted in a surface direction (i.e., X and Y directions) of the circuit board. The grid support is made of at least a material having a thermal expansion coefficient similar to that of the semiconductor wafer.

In the invention, a probe alignment sheet is provided which includes a slit having a cross-sectional area slightly larger than that of the probe near a contact portion with the pad, and width at least equal to or smaller than the width of the to-be-contacted pad in at least one direction thereof. Multiple slits are provided in the probe alignment sheet at positions corresponding to some or all of the pads of the to-be-tested semiconductor chip.

In the invention, the probe units on which the resin-made film probes are stacked or parallel-arranged are provided at each opening of the grid support. Multiple fixing devices are provided to protrude from the grid support at a side to be connected to the circuit board. The fixing devices are inserted in corresponding holes in the circuit board to fix the grid support to the circuit board.

In the invention, there is no or subtle difference between an outer diameter of an inserting section of the fixing device and an inner diameter of the hole in the circuit board around the center of the circuit substrate with the inserting section inserted in the hole, and the difference is larger at the rest of the area of the circuit board. Further, the difference between an outer diameter of an inserting section of the fixing device and an inner diameter of the hole in the circuit board in areas other than around the center of the circuit board becomes successively or intermittently larger toward an outer periphery of the circuit board. Further, the fixing device in areas other than around the center of the circuit board is not restricted in a surface direction (i.e., X and Y directions) of the circuit board.

In this manner, a combination of the hole and the support material with small difference in the inner diameter and the outer diameter can provide a reference position of the fixing frame. Thus, occurrence of initial misalignment between the fixing frame and the contact pads of circuit board can be reduced.

In a state in which the wafer is heated such as in a burn-in test, the terminal pads come apart from the center and are located further toward the outer periphery of the wafer due to thermal expansion of the circuit board. The fixing frame, however, is not affected by the thermal expansion of the circuit board if the hole and the support material with small difference in the inner diameter and the outer diameter are combined and the support material is made of a material having a thermal expansion coefficient similar to that of the semiconductor wafer (e.g., Fe-36Ni alloy).

Accordingly, since the probe units disposed in the fixing frame and the film probes mounted on the probe unit are also not affected by the thermal expansion of the circuit board, occurrence of misalignment between the probes and the chip pads can be reduced, and thus contact failure seldom occur even under high temperature environment.

Further, in a state in which the grid support is fixed to the circuit board, the output terminal of the resin-made film probe is pressed against a terminal of the circuit board with larger force than the predetermined, and is not restricted in a surface direction (i.e., X and Y directions) of the circuit board. As a result, no breakage occurs due to thermal expansion.

In the invention, a probe alignment sheet is provided which includes a slit having a cross-sectional area slightly larger than that of the probe near a contact portion with the pad, and width at least equal to or smaller than the width of the to-be-contacted pad in at least one direction thereof. Thus, the probe can be accurately and easily aligned with the corresponding pads.

BRIEF DESCRIPTION OF THE DRAWINGS

FIG. 5A is a perspective view.

FIG. 7A is a front view.

DESCRIPTION OF THE PREFERRED EMBODIMENTS

Referring now to the drawings, embodiments of the invention will be described. However, the invention is not limited to those described.

Figure 1:
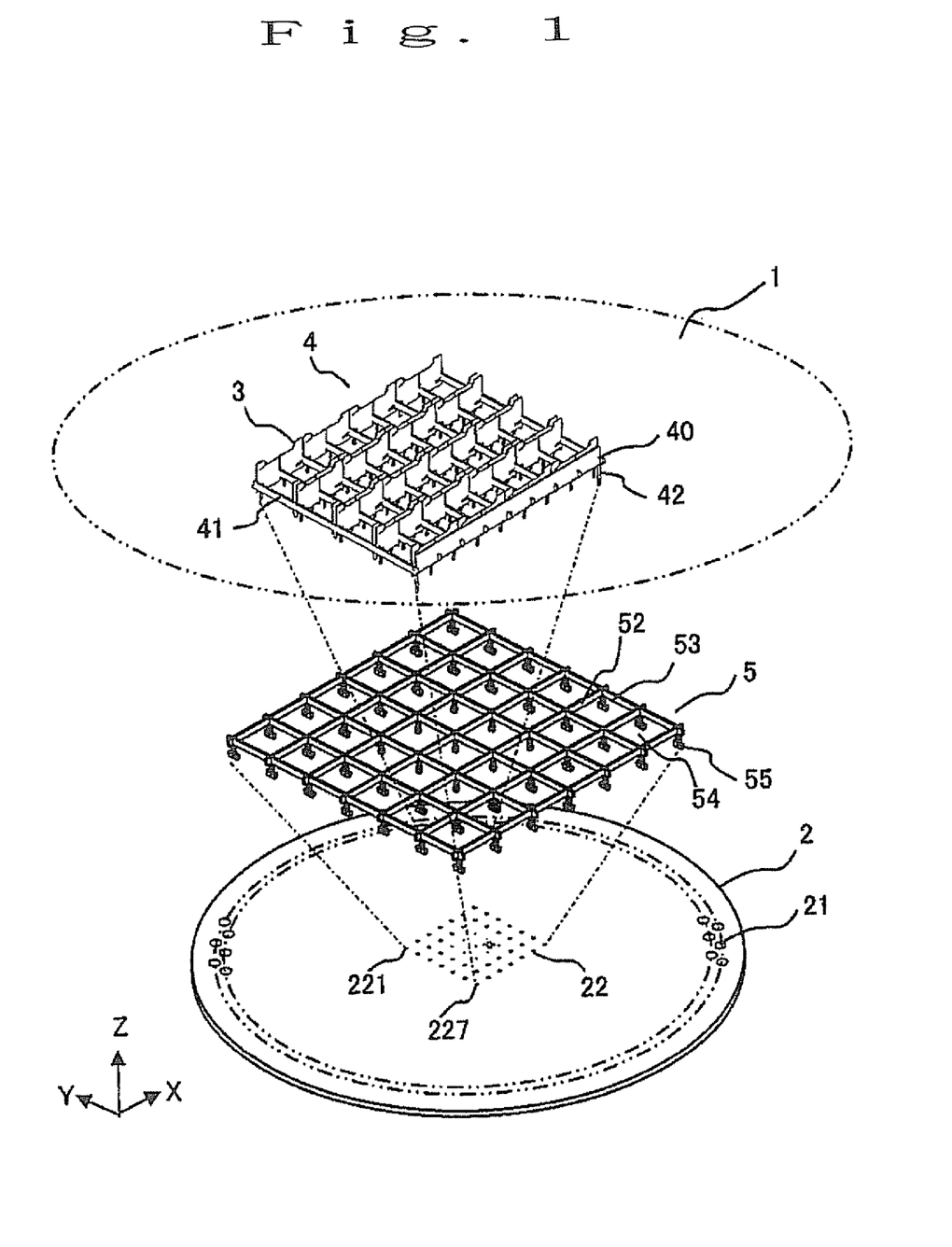
FIG. 1 is a perspective view showing a structure of an electrical signal connector according to an embodiment of the invention.

FIG. 1 is a partially enlarged, schematic perspective view of the entire electrical signal connector according to an embodiment of the invention. In FIG. 1, a semiconductor wafer 1 to be tested, a circuit board 2, a resin-made film probe 3, a probe unit 4, a probe holder 40 and a fixing frame 5 are illustrated.

The film probes 3 disposed to correspond to pads (not shown) on the wafer 1 are supported and fixed on support rods 41 of the probe holder 40, thereby constituting a probe unit 4. In the illustrated example, a probe unit corresponds to 4×4=16 chips. The probe holder 40 includes fixing pawls 42. In FIG. 1, X and Y indicate horizontal directions, and Z indicates a direction perpendicular to the X and Y directions. The fixing frame 5 includes support materials 52 extending in the X direction, and support materials 53 extending in the Y direction. The support materials 52 and 53 intersect with each other to define openings 54. The fixing frame 5 also includes fixing devices 55 provided to protrude at positions to interface with the circuit board 2. The circuit board 2 includes terminal sections 21 for connecting to a card substrate (not shown), electric terminals (not shown) for connecting to a connecting terminal of the later-described film probe 3, and holes 22 into which the fixing devices 55 are placed.

A single probe unit 4 is placed in one of the openings 54 of the fixing frame 5 and fixed there with the pawls 42. The fixing devices 55 are placed in the holes 22 of the circuit board 2. In this manner, an electrical signal connector is produced.

Figure 2:
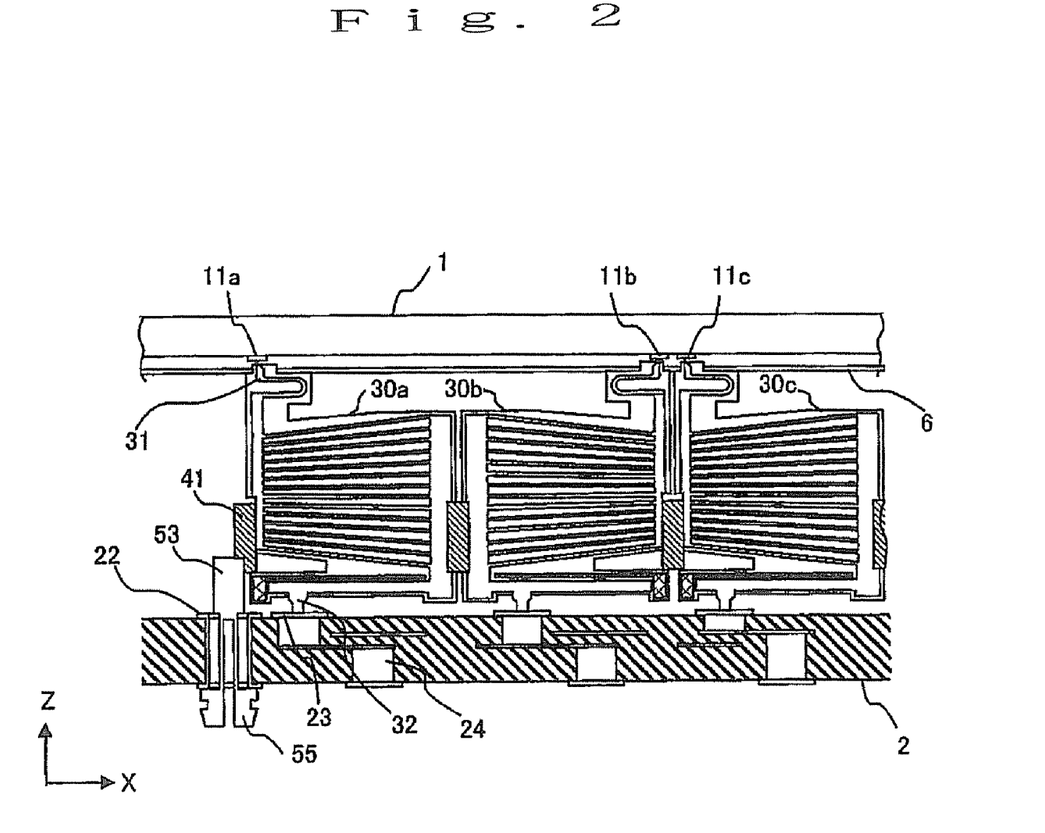
FIG. 2 is a fragmentary cross-sectional view showing a structure of the electrical signal connector according to an embodiment of the invention.

FIG. 2 is a cross-sectional view showing positional relationships of the components of an assembled electrical signal connector. In FIG. 2, film probes 30a, 30b and 30c correspond to pad 11a, 11b and 11c on the chip. Each probe is supported by the support rod 41, which in turn is supported by the support material 53. The fixing frame 5 is fixed to the circuit board 2 with the fixing devices 55 placed in the holes 22.

Later-described output terminals 32 (or 311) of the film probes are kept in contact with pads 23 on the circuit board 2. A probe tip 31 of the film probe contacts with, for example, the pad 11a for inspection.

Figure 3A:
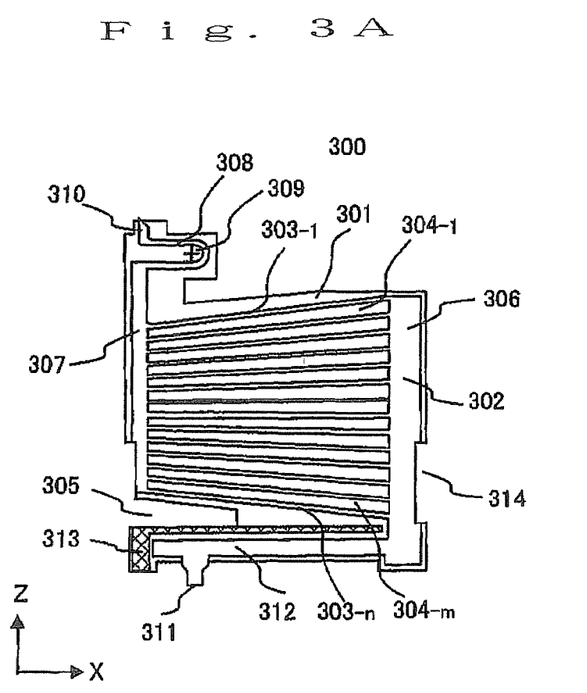
FIG. 3 is a front view showing a structure of a resin-made film probe according to an embodiment of the invention.

Referring to FIGS. 3A to 9, components will be described in detail. First, a structure and a method of manufacturing a film probe 300 will be described in detail with reference to FIGS. 3A and 3B. As shown in FIG. 3A, Metallic foil is attached to a resin film (e.g., polyimide resin) 301. In this embodiment, foil of copper including beryllium copper is used. Then, the copper film is etched to provide a conductive pattern 302. In this embodiment, parallel beams 303-1 to 303-n and slits 304-1 to 304-m of the conductive pattern 302 altogether constitute link mechanisms. The film probe 300 also includes a cut-out portion 305. With this structure, probing operation can be conducted due to the spring force in the Z direction.

Parallel springs herein move in parallel in the Z direction within a certain range with first ends fixed and second ends moved. The parallel springs include substantially identically-shaped beams parallel-arranged and fixed on a common non-deformable support at both ends of the beams. In this embodiment with a fixed part 306 and a vertical probe 307, overdrive acts in the −Z direction.

A rotating deforming part 308 is connected to a tip of the vertical probe 307. When the pad begins contact with the probe tip 310 of the rotating deforming part, overdrive acts to push the probe tip 310 up in a certain amount. Then, the rotating deforming part 308 begins rotating clockwise about a rotational center 309 and scrubbing action begins.

An output terminal 311 is provided to protrude from the resin film 301 in an extension of the fixed portion 306. The output terminal 311 is pressed against an electric terminal pad on the circuit board due to the spring force from a structure of the arm 312 and the notch 305.

Figure 3B:
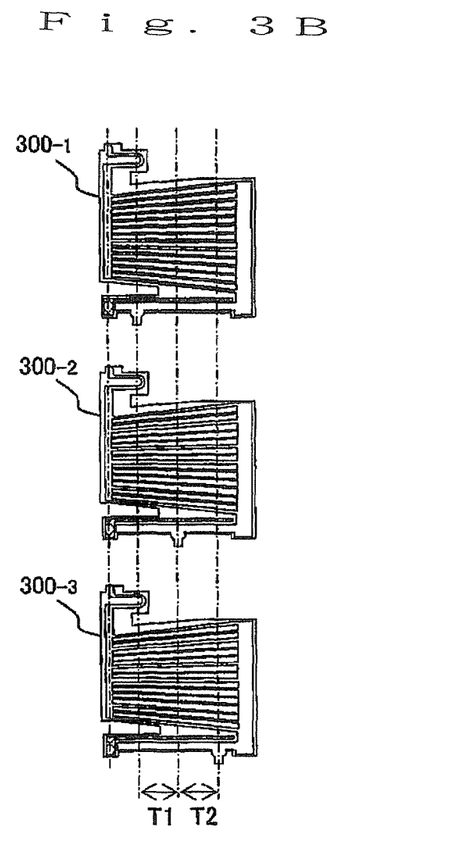

As shown in FIG. 3B, each of the output terminals 311 may be positioned in a shifted manner by an amount of T1 or T2, for example, in accordance with the position of the corresponding electrical terminal on the conversion wiring board. Probes of different configurations may be etched on a single resin film and then cut into pieces. In this manner, probes of different configuration can be provided at low cost. A reinforcement section 313 may be suitably provided by printing a sheet of insulating resin on the resin film 301. Thus, rigidity required for the film probe can be ensured, or alternatively, required electric insulation can be provided. A cut-out 314 of almost the length of the support rod 41 along the Z direction of the probe holder 40 is provided to allow aligned fixation with the support rod 41.

Figure 4:
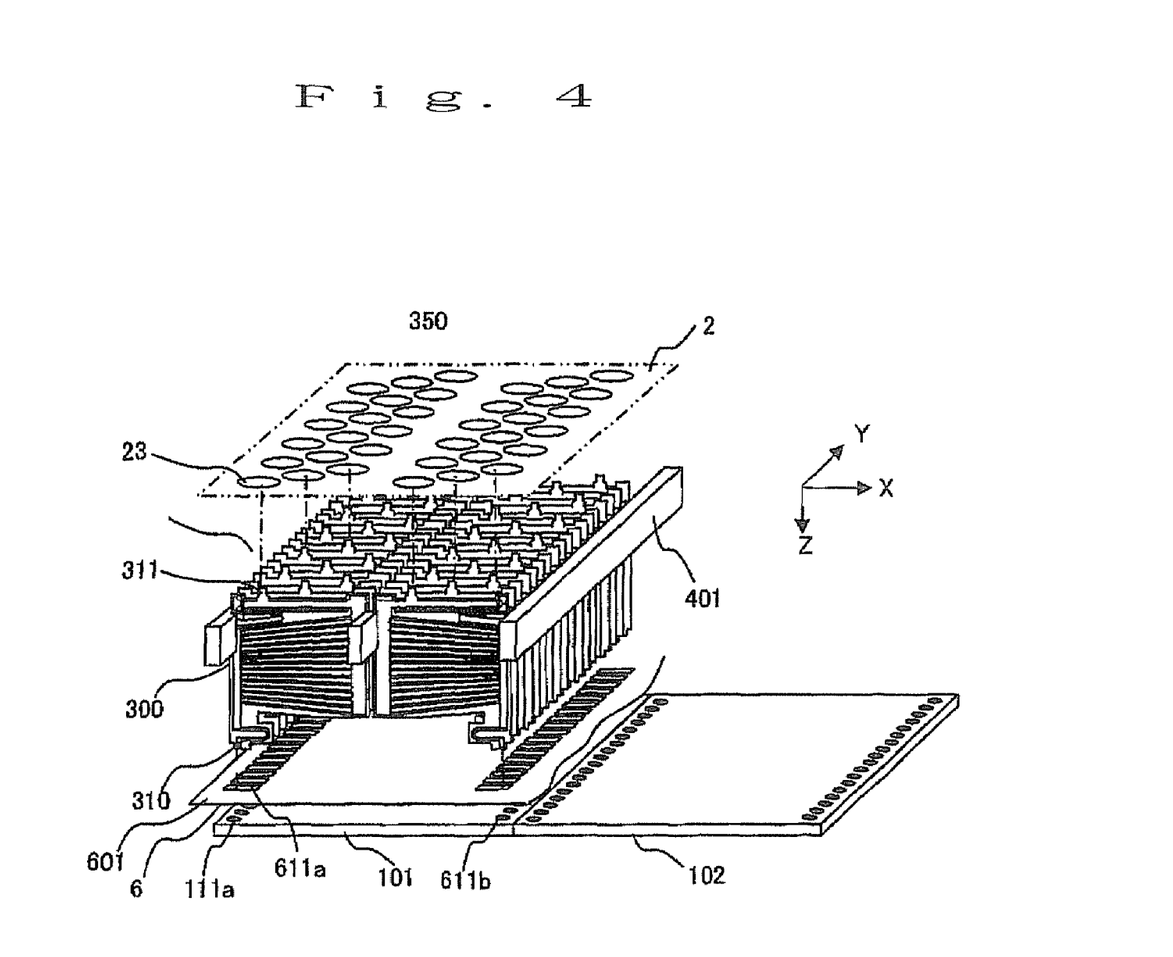
FIG. 4 is a perspective view showing a structure of the resin-made film probe assembly according to an embodiment of the invention.

The film probes shown in FIG. 3 are stacked or parallel-arranged to form a probe assembly as shown in FIG. 4. FIG. 4 illustrates in detail a structure of the probe assembly corresponding to a chip. A probe assembly 350 is a group of probes corresponding to a chip 101 to be tested. FIG. 4 shows a relationship between a chip pad and a contact pad of the circuit board. Components for holding the probes are not illustrated in FIG. 4. The film probes 300 having the structure shown in FIG. 3 are aligned with and fixed to the corresponding chip pads 111a and 111b. In this manner, a probe group corresponding to the chips to be tested 101 is provided.

The film probes may be aligned by, for example, using an alignment sheet 6 shown in FIG. 4. The alignment sheet 6 is formed from a resin film 601 in which slits 611a and 611b are formed to correspond to the pads such as pads 111a and 111b. Each of the slits 611a and 611b has a width that is the same as or slightly narrower than the pad. The probes are accurately aligned with the pads with the vicinity of the probe tips placed within the slits. The output terminals 311 may be provided at separate positions so that output positions of the output terminals 311 can be determined depending on the design pattern of the pads 23 on the circuit board 2.

Figure 5A:
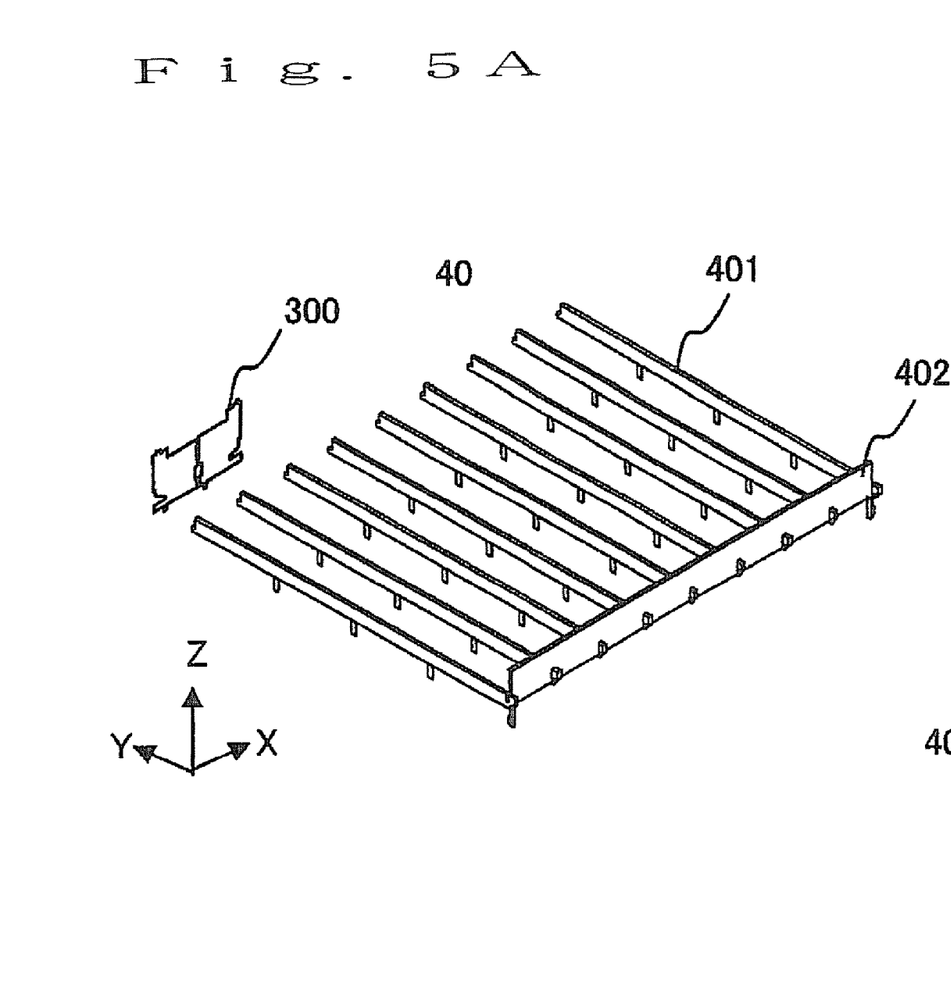
Figure 5B:
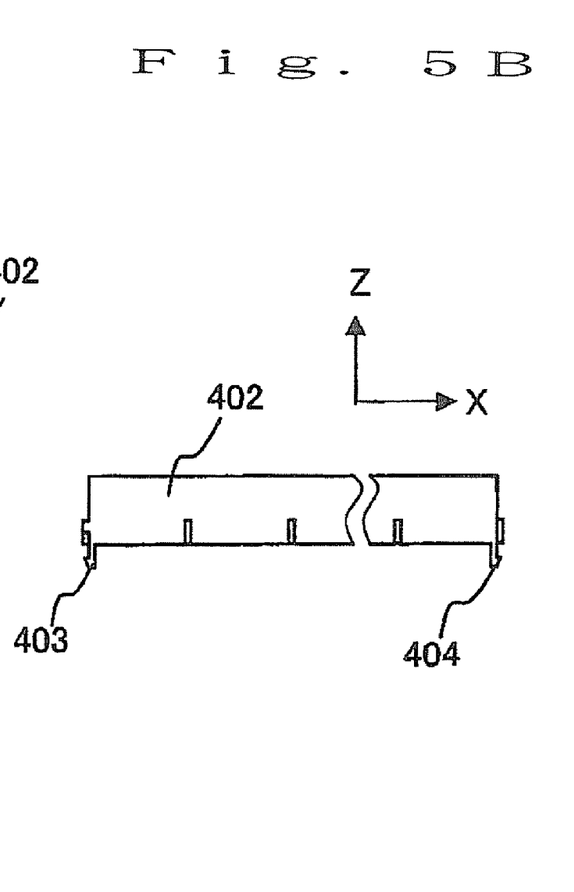
FIG. 5B is a front view of a structure of a probe holder according to an embodiment of the invention.

FIG. 5 shows a structure of a probe holder 40. As shown in FIG. 5A, the probe holder 40 includes a support rod 401 for supporting the probes 300 and a support plate 402 for fixing support rods in an aligned manner. The support rods 401 are fixed by the support plate 402. The probes 300 are mounted from the opening side of the support rods 401 and supported. As shown in FIG. 5B, the probe holder 40 also includes pawls 403 and 404 for fixing the probe holder 40 to the fixing frame 5.

Figure 6:
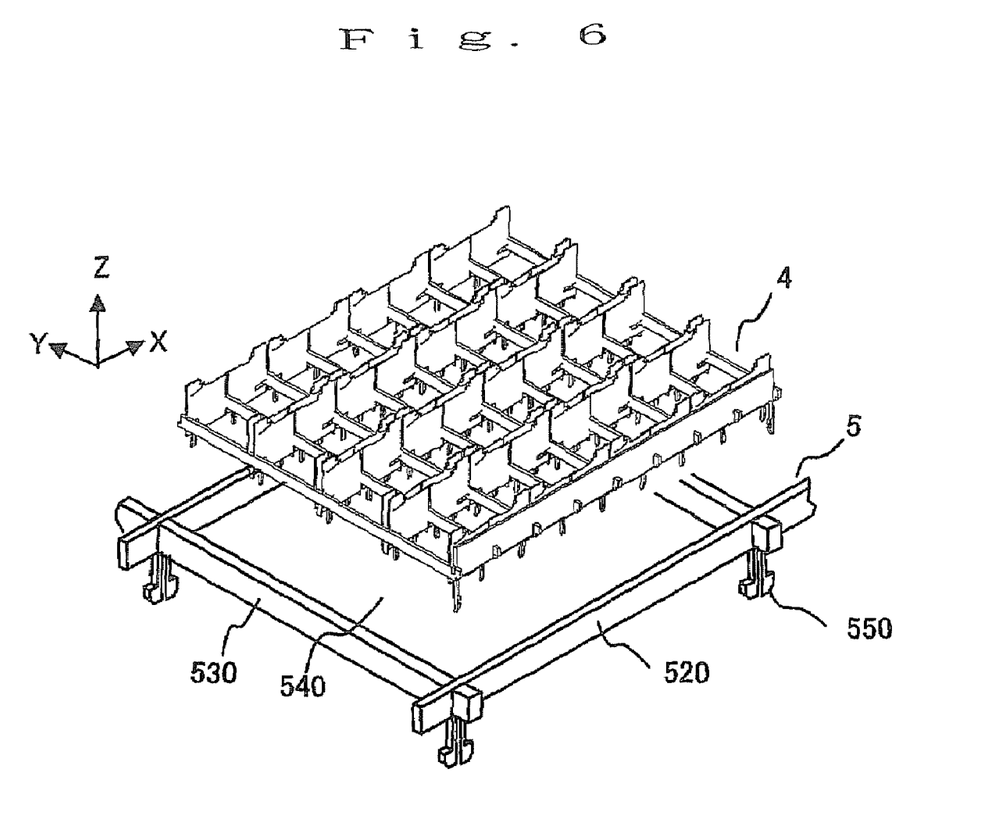
FIG. 6 is a perspective view showing a positional relationship of a probe unit and a fixing frame according to an embodiment of the invention.

FIG. 6 shows the structure of the fixing frame 5 and its relationship with the probe unit 4. In the three-dimensional coordinate system in FIG. 6, X and Y indicate horizontal directions, and Z indicates a direction perpendicular to the X and Y directions. The fixing frame 5 includes support materials 520 extending in the X direction, and support materials 530 extending in the Y direction. The support materials 520 and 530 intersect with each other to define openings 540. The fixing frame 5 also includes fixing devices 550 provided to protrude at positions to interface with the circuit board 2. Each probe unit 4 is placed and fixed in one of the openings 540. The support material 520 may be made of a material having a thermal expansion coefficient similar to that of the semiconductor wafer (e.g., Fe-36Ni alloy) so as to eliminate the influence of elasticity due to thermal expansion.

Figure 7A:
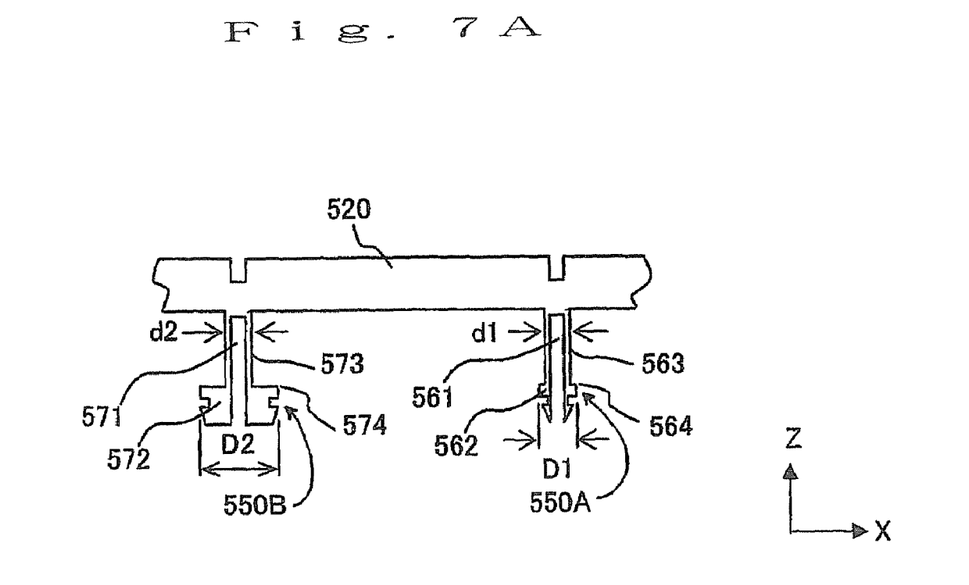
Figure 7B:
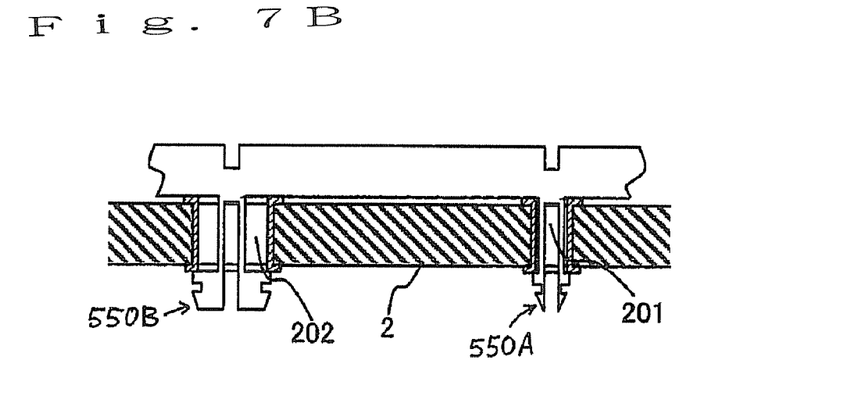
FIG. 7B is a cross-sectional view of components of a fixing frame according to an embodiment of the invention.

FIG. 7A shows a structure of a fixing device of the fixing frame 5. In this embodiment, fixing devices 550A and 550B of different shapes are illustrated. In FIG. 7B, fixing devices are inserted in the circuit board 2. In FIGS. 7A and 7B, the fixing device 550A includes slits 561 to generate spring force in the X direction. Under a condition in which no spring force is exerted, the width D1 of an end portion 562 of the fixing device 550A is slightly larger than the inner diameter of the hole (for example, through hole) 201 in the circuit board in which the end portion 562 is inserted. The width d1 of the inserting portion 563 is slightly smaller than the inner diameter of the hole 201. When the fixing device 550A begins insertion in the hole 201, the end portion 562 contracts inward at the slit 561. When the inserted end portion 562 passes through the hole 201, the width D1 restores its original state due to repulsive force of the spring. The end portion 562 is fixed at an end engaging portion 564. Similarly, the fixing device 550B includes a slit 571 to generate spring force in the X direction. Under a condition in which no spring force is exerted, the width D2 of an end portion 572 of the fixing device 550B is slightly larger than the inner diameter of the hole 202, and the width d2 of the inserting portion 573 is substantially the same as the width d1 of the inserting portion 563 of the fixing device 550A. Accordingly, the difference between the width d2 after insertion of the fixing device 550B and the inner diameter of hole 202, i.e., clearance, is larger than the difference in the fixing device 550A.

Figures 8A, 8B:
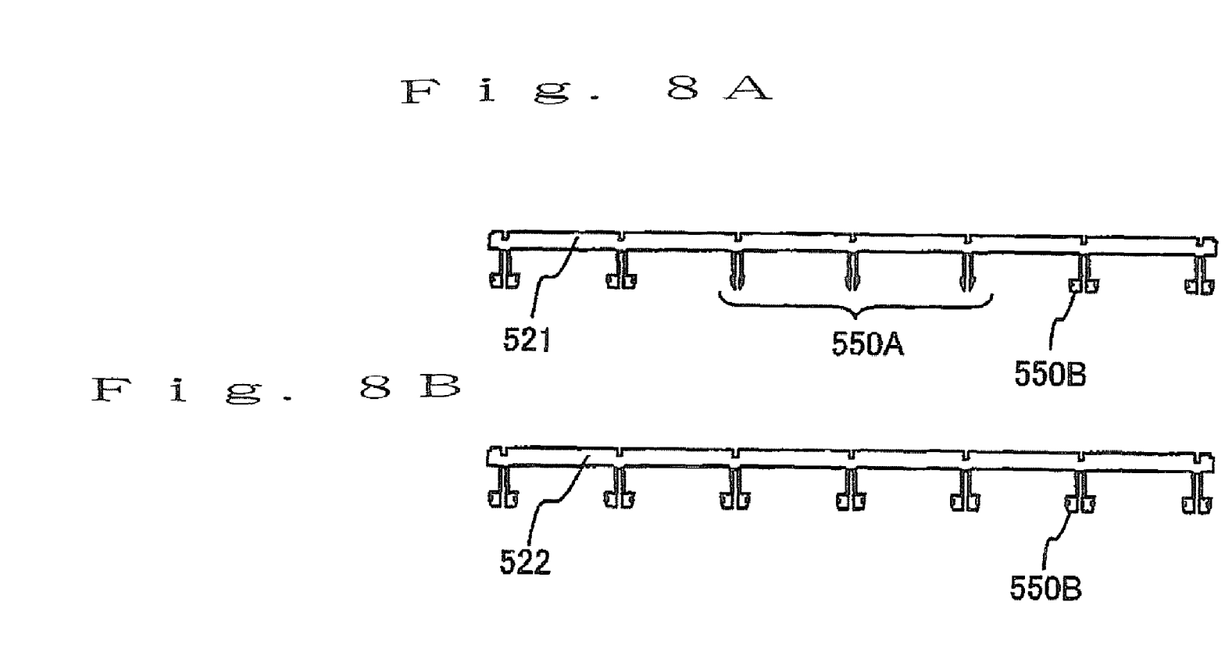
FIG. 8 is a front view of the components of the fixing frame according to an embodiment of the invention.

A structure of the support material with the fixing devices mounted thereon is shown in FIGS. 8A and 8B. FIG. 8A shows a support material 521 which includes both the fixing devices 550A and 550B. FIG. 8B shows a support material 522 which includes only the fixing devices 550B.

Figure 9A:
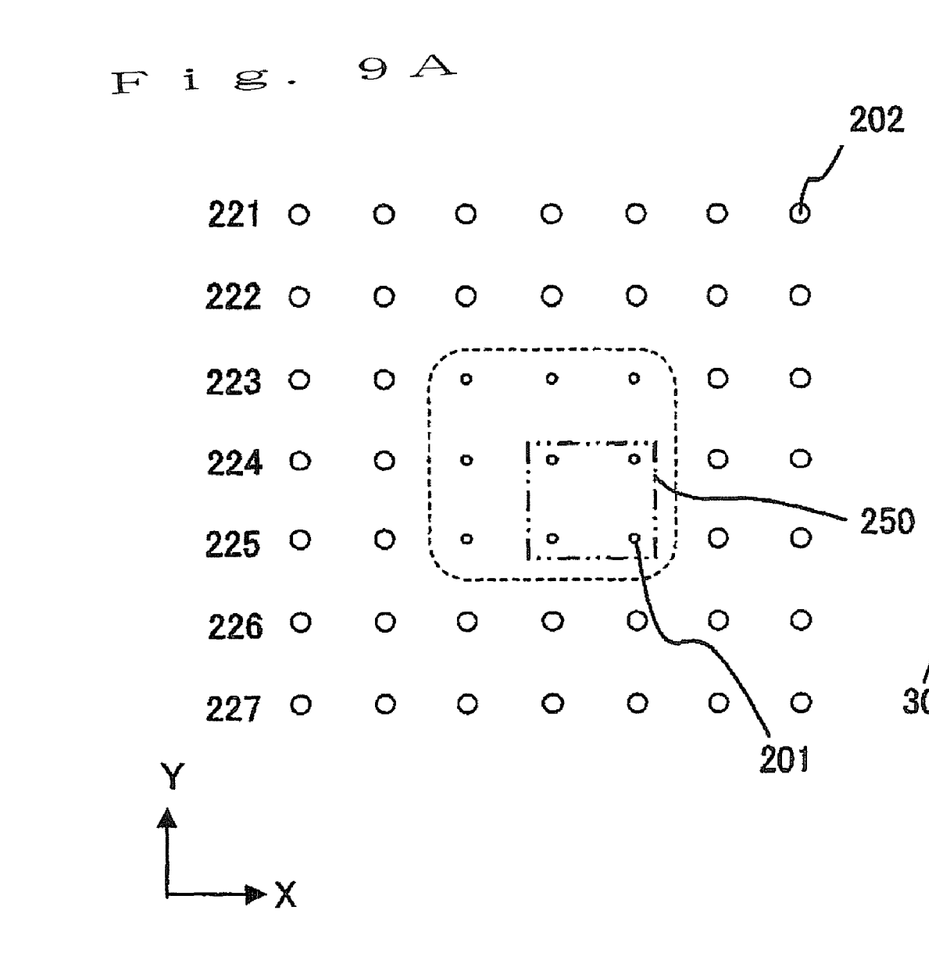
FIG. 9 schematically shows a fixing position of the fixing frame according to an embodiment of the invention.
Figure 9B:
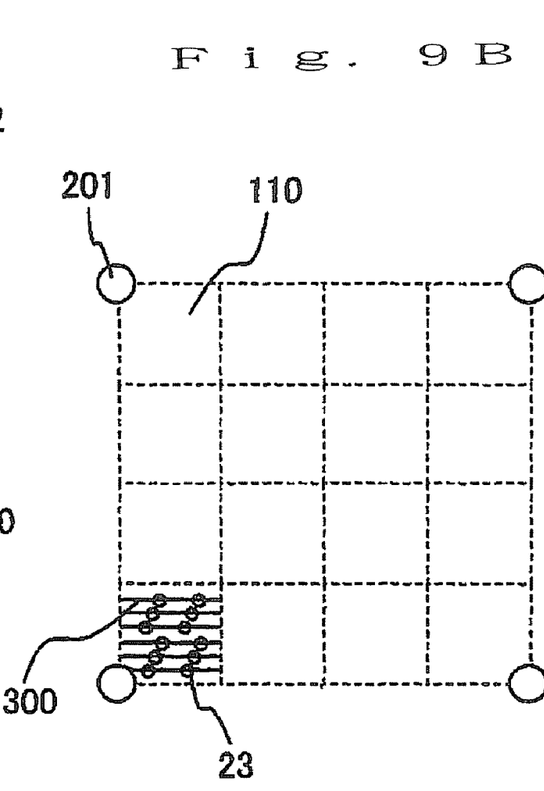

FIGS. 9A and 9B show a positional relationship of holes on the circuit board 2 and the connection pads. FIG. 9A shows a group of fixing holes 22 of FIG. 1 seen from the Z direction. In FIG. 9A, numerals 221 to 227 indicate the row number of the fixing holes. Nine holes 201 (indicated by the dotted line) at the center of the lines 223 to 225 including the neighborhood of the center of the circuit board 2 have small inner diameters. Other holes 202 have large inner diameters. In this case, the support materials corresponding to the circuit board 2 with fixing holes 201 and 202 include the support materials 521 of FIG. 8 to correspond to the lines 223 to 225 and the support materials 522 to correspond to the rest of the lines.

FIG. 9B shows in detail the area 250 occupied by one opening of fixing frame 5, i.e., one probe unit. A range 110 shown by dotted line corresponds to a chip to be tested. The positional relationships of the film probes 300 parallel-arranged and the pads 23 corresponding to the output terminals 311 in each range 110 are shown in FIG. 9B. The film probes 300 and the pads 23 are enlarged for the purpose of illustration.

The operation and effects of the thus-structured electrical signal connector will be described below with reference to the drawings.

As shown in FIG. 1, the probe unit 4 is fixed to the fixing frame 5. Then the support materials 521 for the lines 223 to 225 and the support materials 522 for the rest of the lines are used to correspond to the fixing holes shown in FIG. 9A. In this manner, the following operation and effects are provided.

As shown in FIG. 7B, a combination of the hole 201 having small inner diameter and the support material 550A at the center of the circuit board 2 provides a reference position of the fixing frame 5. In this manner, occurrence of initial misalignment between the fixing frame 5 and the contact pads 23 of circuit board can be reduced.

In a state in which the wafer is heated such as in a burn-in test, the terminal pads come apart from the center and are located further toward the outer periphery of the wafer due to thermal expansion of the circuit board. The fixing frame 5, however, is not affected by the thermal expansion of the circuit board 2 if combinations of the holes with larger inner diameter and the fixing devices 550B are provided on the circuit board 2 excluding the center thereof, and the support material is made of a material having a thermal expansion coefficient similar to that of the semiconductor wafer (e.g., Fe-36Ni alloy). Accordingly, since the probe units 4 disposed in the fixing frame 5 and the film probes 3 mounted on the probe unit 4 are also not affected by the thermal expansion of the circuit board 2, occurrence of misalignment between the probes and the chip pads can be reduced, and thus contact failure seldom occur even under high temperature environment. Since the output terminals 32 of the film probes 300 are pressed against the pads 23 of the circuit board and thus are not restricted in the surface direction (i.e., X and Y directions), the output terminals 32 cannot be broken due to thermal expansion.

Although the holes 201 and 202 are illustrated in this embodiment, holes may alternatively used of which inner diameters vary successively toward the outer periphery of the circuit board.

According to electrical signal connector of the invention, a highly reliable probe card can be obtained which may be used for testing narrow-pitched chips. Even if the invention is used for burn-in testing in which a wafer is placed in a heating device, or if many chips are to be tested simultaneously, occurrence of misalignment between the probes and the pads due to temperature rise can be reduced. Even if misalignment occurs, faulty connection between the probes and the pads or between the probes and the circuit board can be avoided.

The present invention has been described with reference to the preferred embodiments shown in the drawings. However, it will be apparent to those skilled in the art that various changes and modifications can be made without departing from the spirit and scope of the invention.

What is claimed is:

1. An electrical signal connector comprising:
   a probe having a first contact point on one end, a second contact point on another end and a resiliently deformable part in an intermediate portion of the probe;
   said first and second contact points making electric connection by entering into contact with a pad for electric connection created in a semiconductor chip to be tested and a terminal of a circuit board electrically connected with a tester, respectively; and
   a vertically extending plane-shaped resin film for supporting said probe, the resin film having first and second edges spaced in a parallel relation;
   wherein:
   said probe is formed on or connected to a surface of the resin film so that the resiliently deformable part of said probe is positioned between the first and second edges of the resin film and the resiliently deformable part of said probe is in a state resiliently deformable in a first direction, the first direction being perpendicular to the first and second edges of the resin film;
   a plurality of slit-like openings are formed in a portion of the resin film corresponding to the resiliently deformable part of said probe so that at least a portion of the resin film is in a state resiliently deformable in the first direction;
   the first contact point of said probe protrudes from the resin film in a second direction so as to contact with the pad of the semiconductor chip to be tested, the second direction being opposite the first direction and perpendicular to the first and second edges of the resin film;
   the second contact point of said probe is brought into contact in use with the terminal of the circuit board electrically connected with the tester;
   when a force is applied to the first contact point in the first direction,
      the resiliently deformable part of said probe resiliently deforms in the first direction,
      the at least a portion of the resin film resiliently deforms in the first direction,
      the first contact point moves towards the second edge, and
      signals may be transmitted and received between the semiconductor chip to be tested via the first contact point and the tester via the second contact point;
   a probe unit in which a plurality of the resin films and the probes connected thereon are supported in a stacked or parallel arranged manner in a third direction, the third direction being perpendicular to a face of the resin film;

a plurality of support rods support the resin films and the probes in the stacked or parallel arranged manner; and a grid support is provided which includes a plurality of openings, with each of the probes being separately placed and fixed in each of the openings.

2. The electrical signal connector according to claim 1, further comprising a plurality of fixing devices provided to protrude from the grid support at a side to be connected to the circuit board, the fixing devices inserted in corresponding holes in the circuit board to fix the grid support to the circuit board.

3. The electrical signal connector according to claim 2, wherein there is no or subtle difference between an outer diameter of an inserting section of each of the fixing devices and an inner diameter of the corresponding hole in the circuit board around the center of the circuit board with the inserting section inserted in the hole, and the difference is larger at the rest of the area of the circuit board.

4. The electrical signal connector according to claim 2, wherein the difference between an outer diameter of an inserting section of each of the fixing devices and an inner diameter of the corresponding hole in the circuit board in areas other than around the center of the circuit board becomes successively or intermittently larger toward an outer periphery of the circuit board.

5. The electrical signal connector according to claim 2, wherein operation of each of the fixing devices in areas other than around the center of the circuit board is not restricted in a surface direction (i.e., X and Y directions) of the circuit board.

6. The electrical signal connector according to claim 1, wherein, in a state in which the grid support is fixed to the circuit board, the output terminal of the resin-made film probe is pressed against a terminal of the circuit board with larger force than a predetermined force, and is not restricted in a surface direction (i.e., X and Y directions) of the circuit board.

7. The electrical signal connector according to claim 1, wherein the grid support is made of at least a material having a thermal expansion coefficient similar to that of the semiconductor wafer.

8. The electrical signal connector according to claim 1, further comprising a probe alignment sheet which includes a slit having a cross-sectional area slightly larger than that of the portion of the probe near the to-be-contacted pad of the semiconductor chip to be tested, and width equal to or smaller than the width of the to-be-contacted pad in at least one direction thereof.

9. The electrical signal connector according to claim 1, wherein the semiconductor chip to be tested comprises one or more pads, and wherein a plurality of slits are provided in a probe alignment sheet at positions corresponding to some or all of the pads of the to-be-tested semiconductor chip.

* * * * *